United States Patent [19]
Goodman

[11] 4,204,217
[45] * May 20, 1980

[54] TRANSISTOR USING LIQUID CRYSTAL

[75] Inventor: Lawrence A. Goodman, East Windsor, N.J.

[73] Assignee: RCA Corporation, New York, N.Y.

[*] Notice: The portion of the term of this patent subsequent to Jun. 13, 1995, has been disclaimed.

[21] Appl. No.: 926,014

[22] Filed: Jul. 19, 1978

Related U.S. Application Data

[63] Continuation-in-part of Ser. No. 733,446, Oct. 18, 1976, abandoned.

[51] Int. Cl.² ............... H01L 29/78; H01L 49/02; G02F 1/13
[52] U.S. Cl. ............................ 357/23; 357/4; 350/334
[58] Field of Search ............... 357/4, 23; 350/332, 350/333, 334, 336

[56] References Cited

U.S. PATENT DOCUMENTS

| | | | |
|---|---|---|---|
| 3,191,061 | 6/1965 | Weimer | 357/4 |
| 3,379,931 | 4/1968 | Soldano | 357/4 |
| 3,564,135 | 2/1971 | Weimer | 357/4 |
| 3,631,411 | 12/1971 | Kosonooky | 307/311 |
| 3,765,747 | 10/1973 | Pankratz et al. | 350/344 |
| 3,781,862 | 12/1973 | Yamamura | 350/332 |
| 3,824,003 | 7/1974 | Koda et al. | 357/4 |
| 3,840,695 | 10/1974 | Fischer | 357/4 |
| 3,862,360 | 1/1975 | Dill et al. | 357/4 |
| 4,040,073 | 8/1977 | Luo | 357/4 |
| 4,094,582 | 6/1978 | Goodman | 357/23 |

OTHER PUBLICATIONS

Maltese et al "Studio sperimentale del comportamento di strati di semiconduttore in contatto con strati di cristallo liquido" Alta Frequenza vol. 44 (12/75) pp. 727–730.

*Primary Examiner*—Gene M. Munson
*Attorney, Agent, or Firm*—Birgit E. Morris; Allen Bloom

[57] ABSTRACT

A transistor comprises two spaced apart electrodes, a body of semiconductor material between and in contact with the two electrodes, a layer of liquid crystal material in contact with and on said semiconductor body, and a third electrode in contact with the layer of liquid crystal material. Integrated optologic devices are made from these liquid crystal transistors.

11 Claims, 7 Drawing Figures

U.S. Patent     May 20, 1980     4,204,217
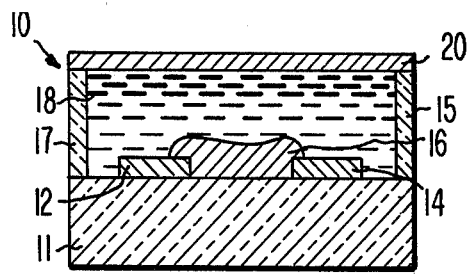
Fig.1
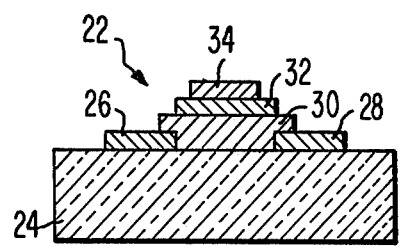
Fig.2   *PRIOR ART*
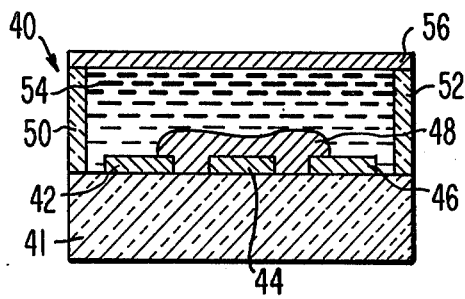
Fig.3
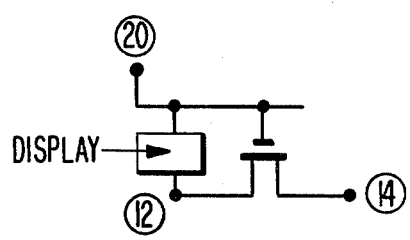
Fig.4
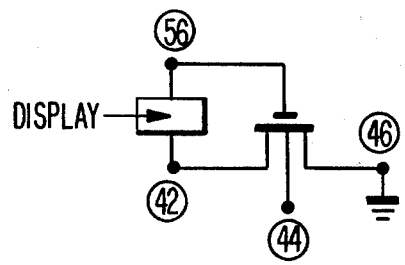
Fig.5
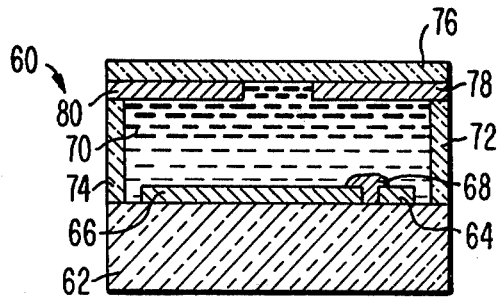
Fig.6
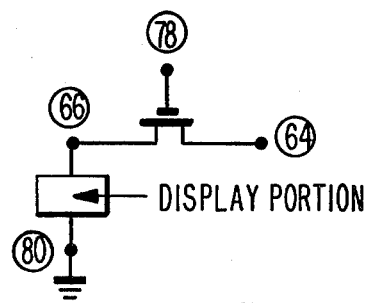
Fig.7

TRANSISTOR USING LIQUID CRYSTAL

REFERENCE TO RELATED APPLICATIONS

This application is a continuation-in-part of copending application Ser. No. 733,446, filed Oct. 18, 1976, now abandoned.

BACKGROUND OF THE INVENTION

The present invention relates to a transistor and more particularly to a transistor using a liquid crystal material.

Transistors are well known in the electronics art. They have found abundant use in virtually unlimited applications. Most are made from silicon, germanium or the III-V materials.

Liquid crystal materials are also well known in the art. Their ability to change optical properties under the influence of applied voltages make them suitable for use in display devices.

The use of a structure comprising a liquid crystal-semiconductor body as a diode has recently been discovered (see for example, "Studio Sperimentale del Comportamento Di Strati Di Semiconduttore In Contatto Con Strati Di Cristalo Liquido" by P. Maltese and C. M. Ottavi, *Alta Frequenza*, V. 44, #12, pp. 727-730 (Dec. 1975). However, the transistor-like properties of liquid crystal materials have not been discussed heretofore.

SUMMARY OF THE INVENTION

A transistor has two spaced apart electrodes, a body of semiconductor material between and in contact with the spaced apart electrodes, a layer of liquid crystal material disposed on and in contact with semiconductor body, and a third electrode in contact with the layer of liquid crystal material.

BRIEF DESCRIPTION OF THE DRAWINGS

FIG. 1 is a schematic cross-sectional view of the transistor of the present invention.

FIG. 2 is a schematic cross-sectional view of an MOS transistor of the prior art.

FIG. 3 is another schematic cross-sectional view of another transistor of the present invention.

FIG. 4 is a schematic circuit diagram of an optologic device using the transistor of FIG. 1.

FIG. 5 is another schematic circuit diagram of an optologic device using the transistor of FIG. 3.

FIG. 6 is a schematic cross-sectional view of an optologic device using the transistor of FIG. 1.

FIG. 7 is a schematic circuit diagram of the optologic device of FIG. 6.

DETAILED DESCRIPTION OF THE DRAWINGS

Referring to FIG. 1, one form of a transistor of the present invention is generally designated as 10. The transistor 10 comprises a substrate 11 having thereon spaced apart first and second electrodes 12 and 14 respectively. A body 16 of semiconductor material is on the substrate 11, between and in contact with the first electrode 12 and second electrode 14. The body 16 can cover the first electrode 12 and the second electrode 14. A layer 18 of liquid crystal material is disposed on and contacts the body 16. A first side wall 15 and a second side wall 17 contain the layer 18. Finally, a third electrode 20 is in contact with and is on the layer 18.

Each of the electrodes, i.e., first electrode 12, second electrode 14 and third electrode 20 is made of a suitably conducting material, such as a metal or conducting tin oxide. Tin oxide, as is well known in the art, is optically transparent. The body 16 can be single crystalline, polycrystalline or amorphous of any semiconducting material such as ZnO, tin oxide, ZnS or $In_2O_3$. The semiconducting material preferably has a high bandgap and thus is relatively light insensitive. Its resistivity is between about $10^3$ to $10^7$ ohm-cm. It can have a thickness of between about 0.5 micron and about 10 microns. The layer 18, having a thickness between about 3 microns and about 30 microns, is of any well known liquid crystal material, such as nematics and cholesterics. The substrate 11 must be of an electrically insulating material, such as glass or quartz. The substrate 11 is not, however, necessary for the operation of the transistor 10. The first side wall 15 and the second side wall 17 can be extensions of the substrate 11. The side walls 15 and 17 are necessary only to contain the layer 18 and to support the third electrode 20. The side walls 15 and 17 are also not necessary for the operation of the transistor 10.

The theory of operation of the transistor 10 is entirely analogous to a MOS (Metal-Oxide-Semiconductor) field effect transistor. A schematic cross-sectional view of a typical MOS transistor is shown in FIG. 2. The MOS transistor 22 comprises a substrate 24 with a source 26 and a drain 28 on the substrate 24. The source 26 and drain 28 are conducting electrodes. A semiconductor body 30 is between and in contact with the source 26 and the drain 28. An oxide body 32 is on the semiconductor 30. Finally, a metal gate 34 is on the oxide body 32. In an entirely similar manner, in the transistor 10 of the present invention, the first electrode 12 is analogous to the source, the second electrode 14 is analogous to the drain, the body 16 is analogous to the semiconductor body 30, the layer 18 is analogous to the oxide body 32, and the third electrode 20 is analogous to the gate. In the transistor 10, the current from the first electrode 12 (source) to the second electrode 14 (drain) is modulated by the field between the third electrode 20 (gate) and the second electrode 14 (drain). Specifically, when the voltage on the third electrode 20 is greater than that on the second electrode 14, the conductivity of the body 16 is high, whereas when the voltage on the third electrode 20 is less than that on the second electrode 14, the conductivity of the body 16 is low. This is similar to the operation of the MOS transistor 22 in which the current from the source 26 to the drain 28 is modulated by the field between the gate 34 and the drain 28.

Referring to FIG. 3 there is shown a cross-sectional view of another transistor 40 of the present invention. The transistor 40 comprises a substrate 41, having thereon spaced apart first, second and third electrodes 42, 44 and 46 respectively. A body 48 of semiconductor material is between and in contact with the first electrode 42 and the third electrode 46, and covers the second electrode 44. The body 48 can also cover the first electrode 42 and the third electrode 46. A layer 54 of liquid crystal material is disposed on and is in contact with the body 48. A first side wall 50 and a second side wall 52 contain the layer 54. Finally, a fourth electrode 56 is in contact with and is on the layer 54. The transistor 40 is like the transistor 10 except with the addition of an electrode between the first electrode 42 and the third electrode 46.

The theory of operation of transistor 40 is also analogous to the four-terminal MOS transistor of the prior art (the four terminals are: the gate, source, drain and substrate). Typically, the substrate is connected electrically to the source or to the drain. For a more complete discussion of MOS devices, see *MOS/LSI Design and Application* by Dr. William Carr and Dr. Jack Mize, McGraw-Hill Book Co., (1972). In transistor 40, the second electrode 44 performs a function analogous to the substrate; the first electrode 42 performs a function analogous to the source; the third electrode 46 performs a function analogous to the drain; and the fourth electrode 56 performs a function analogous to the gate.

The transistors 10 and 40 can be used wherever MOS transistors are used. One typical use of MOS transistor is in the digital switching application, such as in computers. Moreover, the optical property of liquid crystal makes the transistors 10 and 40 ideal for optologic applications.

In such applications, the display portion using liquid crystal and the transistor portion also using liquid crystal can be integrated on one device. Simplicity of manufacturing and lower costs are the benefits.

A schematic circuit diagram of the use of the transistor 10 of FIG. 1 as an optologic device is shown in FIG. 4. To be useful as an optologic device, the third electrode 20 of the transistor 10 must overlap a portion of the first electrode 12, with the layer 18 of the liquid crystal material between and in contact with the first electrode 12 and the third electrode 20. The amount of overlap between the first electrode 12 and the third electrode 20 is determined by the amount of optical region desired. Preferably, the substrate is of a transparent material such as glass and the electrodes 12, 14 and 20 are of a transparent material such as tin oxide. The region of liquid crystal between the portion of the third electrode 20 which overlaps the portion of the first electrode 12, is the optical portion connected electrically to the transistor formed by the third electrode 20 (gate), the first electrode 12 (source) and the second electrode 14 (drain). In a typical application, the third electrode 20 (gate) is connected to a voltage source (not shown). Another voltage source (also not shown) is connected to the second electrode 14 (drain). When the voltage drop between the gate and the drain is zero or less the transistor is "off" and no voltage drop appears across the display portion. With a voltage drop greater than zero between the gate and the drain, the transistor is "on" and a voltage drop appears across the display portion resulting in the display portion being turned "on". Where it is desirable to prevent the turning "on" of the liquid crystal material region between the second electrode 14 and the third electrode 20, the electrodes 14 and 20 should not overlap.

A schematic circuit diagram of the use of the transistor 40 as an optologic device is shown in FIG. 5. To be useful as an optologic device, the fourth electrode 56 of the transistor 40 must overlap a portion of the first electrode 42. Preferably, the substrate is of a transparent material such as glass and the electrodes 42, 44, 46, 56 are of a transparent material, such as tin oxide. Where the fourth electrode 56 overlaps a portion of the first electrode 42, the region of liquid crystal, between the first electrode 42 and the fourth electrode 56, is the optical portion connected electrically to the transistor formed by the second electrode 44 (substrate), the third electrode 46 (drain), the first electrode 42 (source) and the fourth electrode 56. In a typical application, the third electrode 46 (drain) is connected to ground potential. A voltage source (not shown) is connected to the fourth electrode 56 and a voltage source (not shown) is connected to the second electrode 44 (substrate). When the voltage drop between the second electrode 44 and the fourth electrode 56 is zero or less, the transistor is "on" and a voltage drop appears across the display portion. With a voltage drop greater than zero between the second electrode 44 and the fourth electrode 56 the transistor is "off" and no voltage drop appears across the display portion. Again, where it is desirable not to optically activate the region of liquid crystal material between the fourth electrode 56 and the second electrode 44 or the fourth electrode 56 and the third electrode 46, the fourth electrode 56 should not overlap the electrodes 44 or 46.

Another optologic device using the transistor 10 of the present invention is shown in a schematic cross-sectional view in FIG. 6. The optologic device 60 comprises a substrate 62 on which are first electrode 64 and second electrode 66. A body 68 of semiconductor material is between and in contact with the first electrode 64 and the second electrode 66. A layer 70 of liquid crystal composition is on and in contact with the body 68. A first side wall 72 and a second side wall 74 contain the layer 70. A cover 76 rests on the first side wall 72 and the second side wall 74. On the inner surface of cover 76 are a third electrode 78 and a fourth electrode 80. The third electrode 78 and the fourth electrode 80 are in contact with the layer 70. A portion of the fourth electrode 80 overlaps a portion of the second electrode 66. A portion of the third electrode 78 overlaps the semiconductor body 68.

The optologic device 60 is substantially the same as the transistor 10 of FIG. 1, with the addition of a fourth electrode 80. The material and the construction of the optologic device 60 is like the transistor 10. Preferably, the substrate 62 and the cover 76 are of glass or other transparent or translucent material. The electrode 64, 66, 78, 80 are also preferably made of tin oxide or other transparent conductors.

In the use of the optologic device 60, the third electrode 78 is chosen as the gate. Referring to FIG. 7, there is shown a circuit diagram of the optologic device 60. The second electrode 66 and the first electrode 64 are the source and the drain respectively. The fourth electrode 80 is connected to ground. The region of liquid crystal composition between where the fourth electrode 80 overlaps the second electrode 66 is the display portion controlled by the transistor whose gate, drain and source are third electrode 78, first electrode 64 and second electrode 66 respectively. Usually, a voltage source (not shown) is connected to the first electrode 64 (drain). When the voltage drop between the third electrode 78 (gate) and the first voltage electrode 64 (drain) is zero or less, the display portion is not turned "on", i.e., no voltage drop appears across the display portion. The second electrode 66 (source) is at the same potential as the fourth electrode 80. When a positive voltage is applied between the third electrode 78 (gate) and the first electrode 64 the transistor is turned "on". Consequently, the second electrode 66 (source) reaches the voltage level of the first electrode 64 (drain) and the display portion is turned "on".

From the foregoing, it is seen that transistors made from liquid crystal material are particularly useful where they are integrated into optical devices. In particular an optologic device can be used as a segment in a seven-segment numeric display, a light valve in communications and as optical memory in computers.

What is claimed is:

1. A transistor comprising
   a first electrode;
   a second electrode spaced apart from said first electrode;
   a body of semiconductor material between and in contact with said first electrode and said second electrode;
   an insulating substrate having thereon said first electrode, said second electrode and said body;
   a layer of liquid crystal material in contact with and on the semiconductor body; and
   a third electrode in contact with the layer of liquid crystal.

2. The transistor of claim 1 wherein said layer is between about 3 microns and about 30 microns in thickness.

3. The transistor of claim 1 further comprising
   a fourth electrode;
   said fourth electrode being between and in the same plane as said first electrode and said second electrode, in contact with said body and on said insulating substrate.

4. The transistor of claim 3 wherein said layer is between about 3 microns and about 30 microns in thickness.

5. An optologic device comprising
   a first electrode;
   a second electrode spaced apart from said first electrode;
   a body of semiconductor material between and in contact with said first electrode and said second electrode;
   an insulating substrate having thereon said first electrode, said second electrode and said body;
   a layer of liquid crystal material in contact with and on the semiconductor body; and
   a third electrode in contact with said layer, at least a portion of said third electrode overlapping said first electrode.

6. An optologic device in accordance with claim 5 further comprising
   a fourth electrode being between and in the same plane as said first electrode and said second electrode, in contact with said body and on said insulating substrate.

7. A transistor comprising
   a first electrode;
   a second electrode spaced apart from said first electrode;
   a body of semiconductor material between and in contact with said first electrode and said second electrode;
   an insulating substrate having thereon said first electrode, said second electrode and said body;
   a layer of liquid crystal material which is between about 3 microns and about 30 microns in thickness in contact with and on the semiconductor body which is between about 0.5 micron and about 10 microns in thickness; and
   a third electrode in contact with the layer of liquid crystal.

8. The transistor of claim 7 wherein said body is a material selected from the class consisting of ZnO, $SnO_2$, ZnS and $In_2O_3$.

9. The transistor of claim 7 further comprising
   a fourth electrode;
   said fourth electrode being between and in the same plane as said first electrode and said second electrode, in contact with said body and on said insulating substrate.

10. The transistor of claim 9 wherein said body is a material selected from the class consisting of ZnO, $SnO_2$, ZnS and $In_2O_3$.

11. An optologic device comprising
    a first electrode;
    a second electrode spaced apart from said first electrode;
    a body of semiconductor material between between and in contact with said first electrode and said second electrode;
    an insulating substrate having thereon said first electrode, said second electrode and said body;
    a layer of liquid crystal material in contact with and on the semiconductor body;
    a third electrode in contact with said layer, at least a portion of said third electrode overlapping said first electrode; and
    a fourth electrode in contact with said layer, spaced apart from said third electrode and at least a portion of said fourth electrode overlapping said body.

* * * * *